United States Patent [19]

Solberg

[11] Patent Number: 5,343,362
[45] Date of Patent: Aug. 30, 1994

[54] HEAT SINK ASSEMBLY

[75] Inventor: Terry B. Solberg, Golden Valley, Minn.

[73] Assignee: Zytec Corporation, Eden Prairie, Minn.

[21] Appl. No.: 178,928

[22] Filed: Jan. 7, 1994

[51] Int. Cl.⁵ .............................................. H05K 7/20
[52] U.S. Cl. ............................... 361/710; 165/80.3;
  165/185; 174/16.3; 257/719; 257/727
[58] Field of Search ............... 174/16.3; 165/80.3,
  165/185; 257/706–707, 712–713, 718–719,
  726–727; 361/690, 704, 707–711, 715–722, 807,
  809–811, 829

[56] References Cited

U.S. PATENT DOCUMENTS

| | | | |
|---|---|---|---|
| 4,193,444 | 3/1980 | Boyd et al. | 174/16.3 |
| 4,739,452 | 4/1988 | Fukunaga | 361/810 |
| 5,172,756 | 12/1992 | Jayamanne et al. | 361/720 |
| 5,184,281 | 2/1993 | Samarov et al. | 174/16.3 |
| 5,191,512 | 3/1993 | Osura et al. | 361/720 |
| 5,272,599 | 12/1993 | Koenen | 257/727 |

*Primary Examiner*—Gregory D. Thompson
*Attorney, Agent, or Firm*—Merchant, Gould, Smith, Edell, Welter & Schmidt

[57] ABSTRACT

A heat sink assembly 10 having a component clip 24 for mounting an electronic component 12. The heat sink body 16 includes a planar mounting surface 26 providing flexible positioning for the component 12. The heat sink body 16 is affixed to the circuit board 14 by a mounting rail 20 providing flexible positioning of the heat sink body 16 on the circuit board 14.

8 Claims, 2 Drawing Sheets

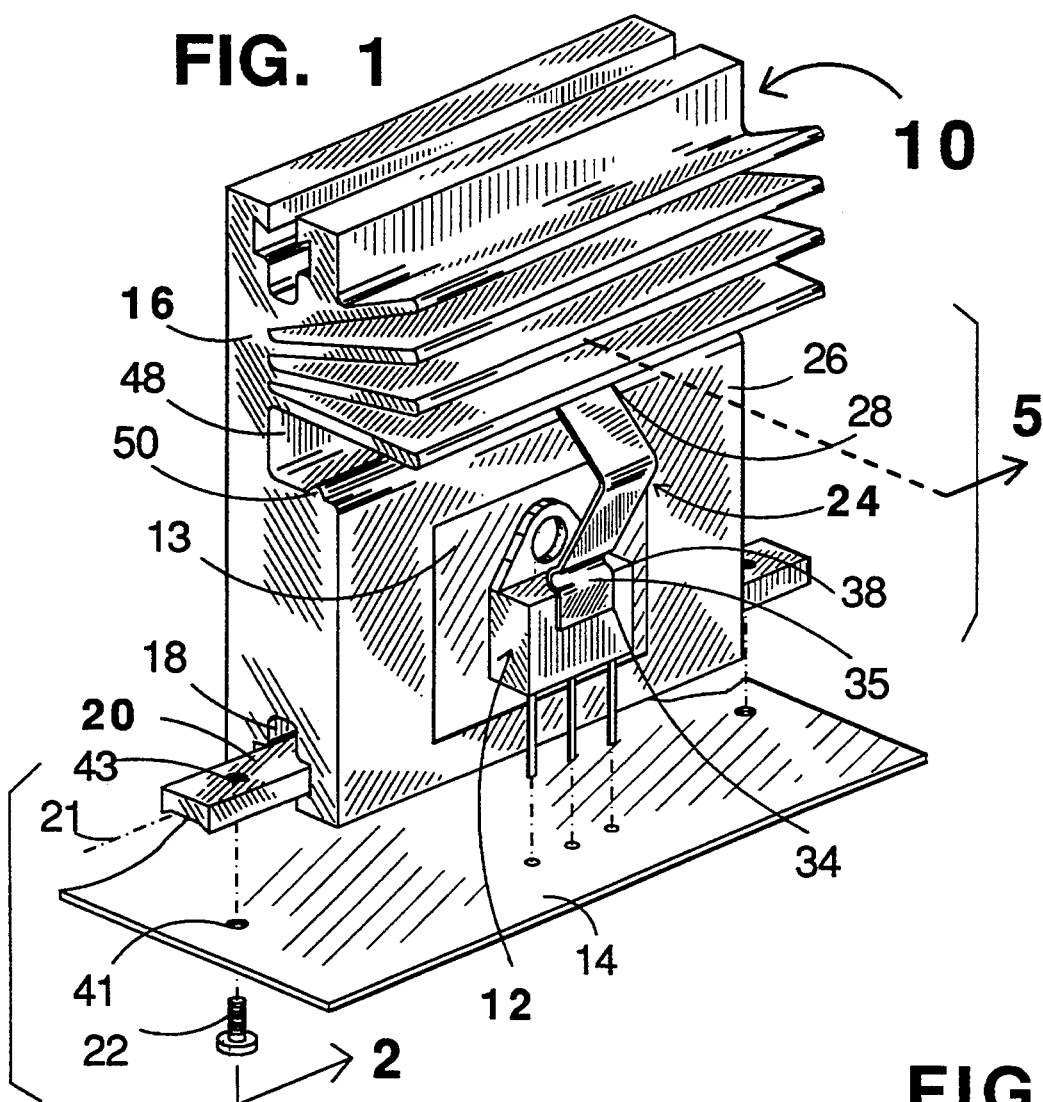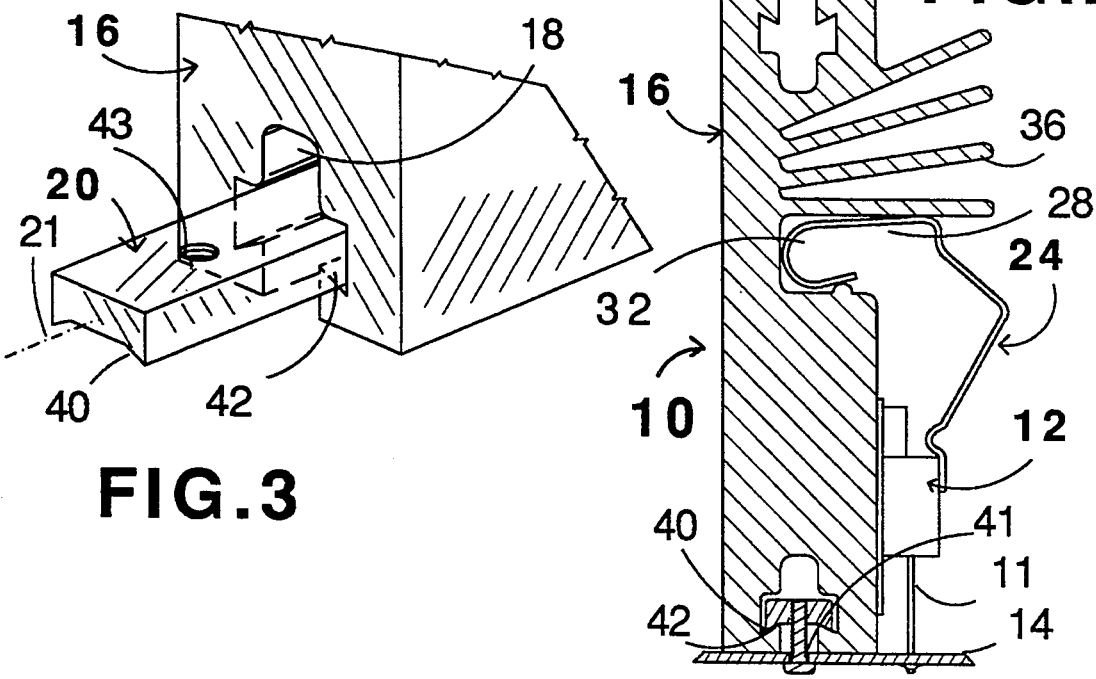

HEAT SINK ASSEMBLY

TECHNICAL FIELD

The present invention relates to a heat sink assembly for mounting electronic components to dissipate the heat generated by the electronic components.

BACKGROUND ART

Many electronic components such as integrated circuits, transistors, rectifiers and the like can generate large amounts of heat. In many products it is common to attach the electronic component to a "finned" heat sink which conducts heat away from the electronic component package and transfers the heat to the ambient air. Smaller heat sinks may be directly attached to the electronic component. These small heat sinks are supported by the electronic package. Larger heat sinks are usually mechanically mounted to the printed circuit board and the electronic component is mounted to the heat sink with a screw or the like.

Conventional heat sink assemblies suffer from several defects. Typically the location of the electrical component on the sink is fixed by a screw hole and the location of the sink on the printed circuit board is fixed by a screw hole as well. As a consequence, tolerance stacking between these various elements makes it difficult to achieve rapid automated mounting and assembly of the electronic component and the heat sink assembly. Although screw attachment can generate high clamping forces in excess of 100 lbs force, they are easily stripped if they are over torqued. Also each heat sink is generally specially made for the particular application which increases the cost of the heat sink assembly.

SUMMARY

The heat sink assembly 10 of the present invention includes an extruded heat sink body 16 and a complimentary mounting rail 20 which is used to mount the heat sink body 16 to a printed circuit board 14. The heat sink assembly 10 also includes a component clip 24 which is used to mount the electronic component 12 to the heat sink body 16.

The heat sink body 16 includes a planar component mounting surface 26, a rail mounting groove 18 and a component clip mounting channel 48. The component clip 24 has a spring arm 30 and an anchor arm 28. The anchor arm 28 terminates in an anchor bend 32 and the spring arm 30 terminates in a component locating end 38. The spring arm 30 and anchor arm 28 are joined at a bend 46. The two arms of the component clip 24 permit the component clip to function as a spring pressing the electronic component 12 against the heat sink body 16.

In use, a component 12 placed under the spring arm 38 deflects the bend 46 into contact with the clip mounting channel 48 which causes the bend 46 to act as a fulcrum. This causes an elastic deflection of the component clip 24 producing a clamping force to hold the electrical component 12 against the planar mounting surface 26.

In use, the electronic component 12 will be typically soldered into the printed circuit board 14. The electrical component 12 is then pressed tightly against the planar mounting surface 26 of the heat sink body 16 by the component clip 24. The heat sink body 16 is attached to the printed circuit board 14 (or other structure) by a several screws typified by screw 22. The screws pass through the printed circuit board 14 into the mounting rail 20. Tightening the screw 22 grips the heat sink body 16 tightly to the mounting rail 20 preventing lateral movement of the heat sink body 16 along the mounting rail axis 21.

This construction provides great latitude in heat sink body 16 placement on the printed circuit board 14 and great latitude of electronic component 12 placement on the planar mounting surface 26. These structures facilitate rapid assembly and permits modular design of the heat sink assembly.

BRIEF DESCRIPTION OF THE DRAWINGS

An illustrative and exemplary heat sink assembly is shown in the accompanying drawings, wherein like reference numerals refer to identical structure throughout and in which:

FIG. 1 is a perspective view showing the invention in use;

FIG. 2 is a cross section view of the heat sink assembly;

FIG. 3 is a perspective view of a portion of the heat sink assembly;

DETAILED DESCRIPTION

Figure 4:
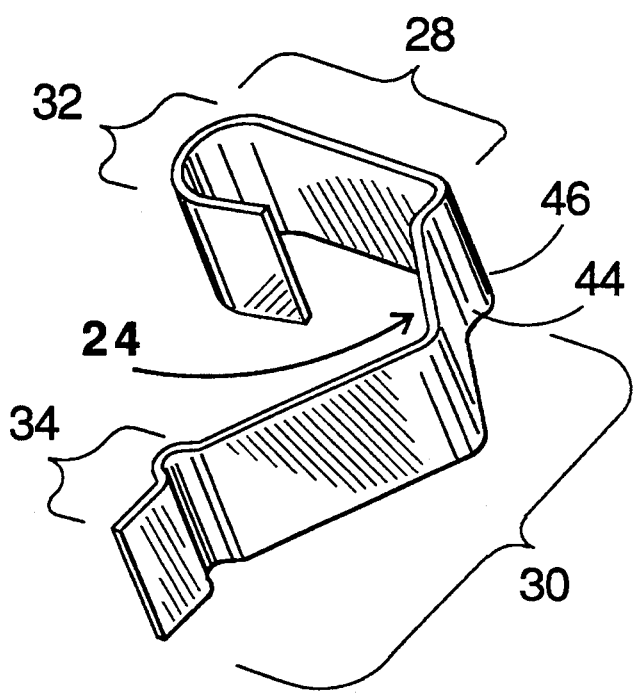
FIG. 4 is a perspective view of the component clip.

FIG. 1 is a schematic perspective diagram which depicts a representative and illustrative heat sink assembly 10. The component clip 24 holds the electronic component 12 against heat sink body 16. In a typical application the electronic component 12 will include a large area mounting tab which is used to transfer heat to a heat sink body. Heat is dissipated to the ambient air by fins typified by fin 36 (FIG. 2). The profile of the extrusion used to from the heat sink body may take a variety of shapes and the fin pattern shown in the figures is exemplary and not intended to limit the scope of the invention. To achieve electrical isolation between the heat sink body 16 and the electronic component 12, a layer of high thermal conductivity material such as insulator 13 may be placed between the electronic component 12 and the heat sink body 16.

In general, only one component clip 24 is required to mount the electronic component 12 but an additional component clip 24 could be used if required. In practice, the component clip of the present invention generates more than 10 lbs of clamping force which exceeds the force generated by prior spring retention assemblies. In general, the heat sink body 16 will include at least one component clip mounting channel 48, which includes a ledge or ridge 50. The component clip mounting channel 48 and ridge 50 cooperate with the anchor bend 32 of the component clip 24 (see FIG. 2) to retain the component clip 20 on the heat sink body 16.

FIG. 2 shows a cross-section of the heat sink assembly 10 in use. The electronic component 12 is seated on the circuit board 14 and the component leads 11 are soldered to the board. The screw clearance hole 41 is aligned with the threaded screw hole 43 (see FIG. 3) in the mounting rail 20. In use, a screw is threaded through the mounting rail 20 and draws the mounting rail surface 40 into contact with the heat sink body surface 42. These surfaces form a dove tail to prevent the heat sink body 16 from flaring out under screw pressure.

FIG. 3 shows these structures in perspective view. The dove tail surfaces also prevent the mounting rail 20 from contacting the surface of the circuit board 14. The mounting rail 20 defines a rail axis 21 and the heat sink body 16 may be moved anywhere along the mounting rail 20 along this axis 21. Although screws are preferred for mounting the rail rivets are also useful for many applications.

FIG. 4 shows the component clip 24 in isolation. The component clip 24 includes an anchor arm 28 which is connected to a spring arm 30 through a bend 46. In the figure the length of the anchor arm is exaggerated and it is preferred to "shorten" the length of the anchor arm to limit the overall volume of the heat sink assembly 10. The spring arm 30 has a thrust surface 34 while the anchor arm 28 terminates in an anchor bend 32. Preferably the thrust surface includes crease 35 or the like. When the electronic component 12 is placed under the crease 35 or the like, the crease 35 abuts the electronic component 12 but is free to slide on the surface of the electronic component 12. Therefore the clamping force is essentially independent of where the crease 35 touches the electronic component 12.

Figure 5:
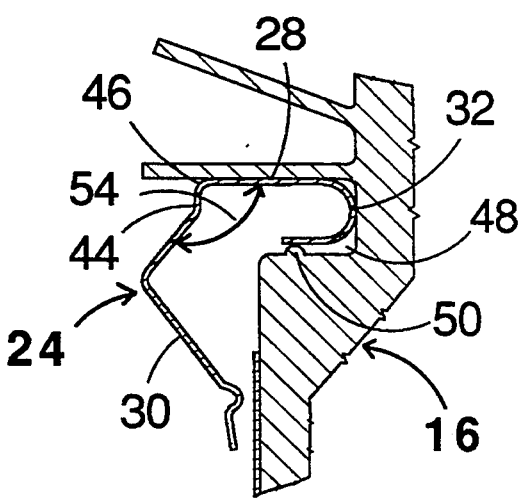
FIG. 5 is a cross-section of a portion of the heat sink assembly.

FIG. 5 depicts component clip 24 loosely fitted in the mounting groove 48. In this drawing the component clip 24 is in the "relaxed" state and the cantilever spring arm angle 54 is acute. In this view it can be seen that the anchor bend 32 substantially spans the clip mounting channel 48.

Figure 6:
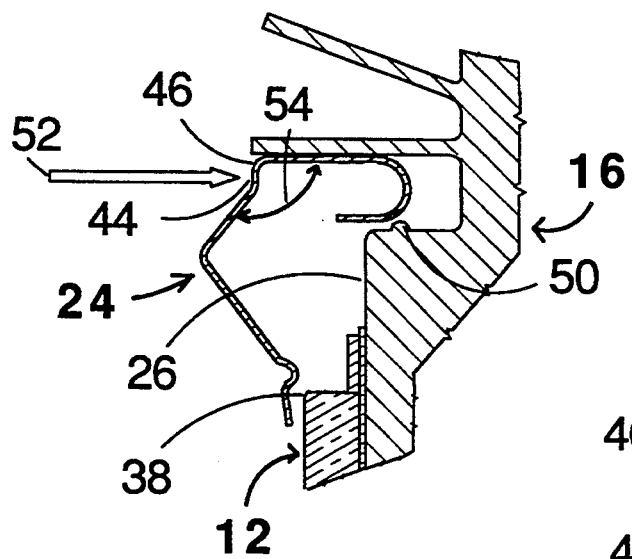
FIG. 6 is a cross-section of a portion of the heat sink assembly.

FIG. 6 depicts the installation procedure for the component clip 24. In general the electronic component 12 will be positioned relative to the heat sink body 16. The anchor bend 32 of the component clip 24 is inserted into the clip mounting channel 48 while the component locating end 38 abuts the electronic component 12. The tool land 44 area on the component clip 24 is provided to seat a tool to permit the clip to be pushed onto the heat sink body 16 as depicted by force vector 52.

Figure 7:
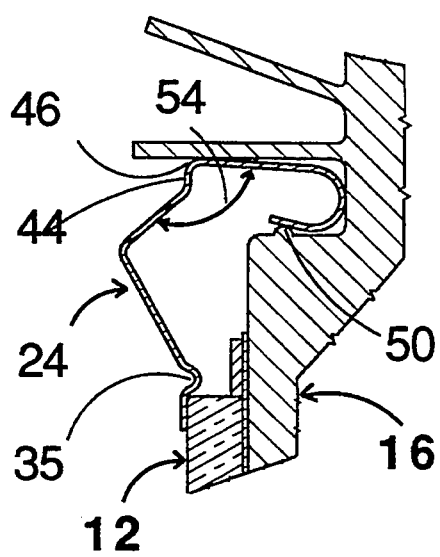
FIG. 7 is a cross-section of a portion of the heat sink assembly.

FIG. 7 shows the component clip 24 fully seated in the heat sink body 16 with the component clip 24 in the "stressed" state. In this position the arm angle 54 of the bend 46 is approximately ninety degrees. The bend 46 abuts the clip mounting channel 48 and acts as a fulcrum to distribute the elastic stresses throughout the component clip 24. The ridge 50 cooperates with the component clip 24 to generate an audible and tactile "click" as the component clip 24 bottoms out in the clip mounting channel 48. In FIG. 6 the crease 35 abuts the an edge of the electronic component 12 package and helps to align it which is useful in some automated assembly processes.

As may be seen in the drawing the component clip 24 has a substantially uniform thickness throughout. The distribution of stress in the component clip 24 is distributed between the anchor arm 28 and the spring arm 30 by displacement about the bend 46. The stresses within the component clip 24 are related to the angles and in general arm angle 54 increases as the component clip 24 is seated in the clip mounting channel 48. Removal of the electronic component is accomplished by moving the electronic component 12 from under the component locating end 38. Once the component 12 is removed, the anchor bend 32 of the component clip 24 may be easily removed from the clip mounting channel 48.

Although an exemplary embodiment of the heat sink assembly 10 is disclosed herein many possible variations are contemplated within the scope of the invention which is to be interpreted by the following claims.

What is claimed is:

1. A heat sink assembly for mounting an electronic component comprising:
   a heat sink body, having a planar component mounting surface, and having a rail mounting groove, and having a component, clip mounting channel proximate said planar component mounting surface;
   a mounting rail positioned within said rail mounting groove, said mounting rail defining a mounting axis;
   a component clip having a spring arm and having an anchor arm, said anchor arm position in said component clip mounting channel, said spring arm coupled to said anchor arm by a bend;
   whereby a component placed under said spring arm deflects said bend into contact with a portion of said clip mounting channel causing said bend to act a fulcrum and thereby elastically deflecting said component clip producing a clamping force to hold the component against said planar surface.

2. The heat sink assembly of claim 1 wherein planar surface does not intersect with said mounting axis.

3. The heat sink assembly of claim 1 wherein said component clip further comprises a thrust surface for contacting the electronic component.

4. The heat sink assembly of claim 1 wherein said component clip further comprises a thrust surface for contacting the electronic component, includes a crease for abutting the electronic component, whereby said clamping force is essentially independent of the portion of said crease on the electronic component.

5. The heat sink assembly of claim 1 wherein said anchor arm further comprise an anchor bend formed at the terminal end of said anchor arm.

6. The heat sink assembly of claim 2 wherein said anchor arm further comprises an anchor bend formed at the terminal end of said anchor arm.

7. The heat sink assembly of claim 6 wherein said component clap mounting channel includes a ridge parallel to said mounting axis and contacting a portion of said anchor bend;
   whereby said anchor bend is elastically deformed by placement of the electronic component under said component clip.

8. A heat sink assembly for mounting an electronic component comprising:
   a heat sink body, having a planar component mounting surface, and having a rail mounting groove, and having a component clip mounting channel proximate said planar component mounting surface;
   a mounting rail positioned within said rail mounting groove, said mounting rail defining a mounting axis;
   a component clip having a spring arm and having an anchor arm, said anchor arm positioned in said component clip mounting channel;
   said anchor arm further comprise an anchor bend formed at the terminal end of said anchor arm, said spring arm coupled to said anchor arm by a bend;
   said component clip mounting channel including a ridge parallel to said mounting axis contacting a portion of said anchor bend;
   whereby an electronic component placed under said spring arm deflects said bend into contact with a portion of said clap mounting channel causing said bend to act a fulcrum and thereby elastically deflecting said component clip producing a clamping force to hold the electronic component against said planar surface.

* * * * *

UNITED STATES PATENT AND TRADEMARK OFFICE
CERTIFICATE OF CORRECTION

PATENT NO. : 5,343,362
DATED : August 30, 1994
INVENTOR(S) : Terry B. Solberg

It is certified that error appears in the above-indentified patent and that said Letters Patent is hereby corrected as shown below:

In column 1, line 67, after the word "by", please delete "a"

In column 2, line 42, please delete the word "from" and insert therefor --form--

In column 3, line 50, after the word "abuts", please delete the word "the"

In column 4, line 13, please delete the word "position" and insert therefor --positioned--

In column 4, line 17, after the word "with, please delete the words "a porton of"

In column 4, line 21, before the word "component", please insert --electronic--

In column 4, line 39, please delete the word "clap", and insert therefor --clip--

In column 4, line 40, please delete "contacting a portion of" and insert therefor --adapted to receive--

UNITED STATES PATENT AND TRADEMARK OFFICE
CERTIFICATE OF CORRECTION

PATENT NO. : 5,343,362
DATED : August 30, 1994
INVENTOR(S) : Terry B. Solberg

It is certified that error appears in the above-indentified patent and that said Letters Patent is hereby corrected as shown below:

In column 4, lines 59 and 60, please delete "contacting a portion of" and insert therefor --and adapted to receive--

In column 4, lines 62 and 63, please delete "a portion of said clap" and insert therefor --said clip--

Signed and Sealed this

Second Day of May, 1995

Attest:

BRUCE LEHMAN

*Attesting Officer*    *Commissioner of Patents and Trademarks*